United States Patent
Bryan et al.

[11] Patent Number: 5,955,924
[45] Date of Patent: Sep. 21, 1999

[54] DIFFERENTIAL METAL-OXIDE SEMICONDUCTOR (CMOS) PUSH-PULL BUFFER

[75] Inventors: Thomas Clark Bryan, Encinitas; Harry Huy Dang, San Diego, both of Calif.

[73] Assignee: Applied Micro Circuits Corporation, San Diego, Calif.

[21] Appl. No.: 09/063,528

[22] Filed: Apr. 21, 1998

[51] Int. Cl.[6] .................................. H03F 3/18; H03F 3/26
[52] U.S. Cl. ............................................ 330/264; 330/268
[58] Field of Search .................................. 330/253, 255, 330/264, 269, 274, 268

[56] References Cited

U.S. PATENT DOCUMENTS 3,870,966  3/1975  Dingwall ................................ 330/255
4,959,623  9/1990  Khoury ................................... 330/265
5,146,181  9/1992  Bowers et al. ......................... 330/268

*Primary Examiner*—Robert Pascal
*Assistant Examiner*—Patricia Nguyen
*Attorney, Agent, or Firm*—Gray Cary Ware Freidenrich

[57] ABSTRACT

A differential cMOS push-pull buffer includes a pair of push-pull sections, a cMOS current source transistor connected to the push-pull sections for providing current thereto, and two cMOS trickle current transistors, each connected to an output node of a respective push-pull section for conducting a trickle current at the output node. In each push-pull section a trickle current enhances the speed of operation, thereby maintaining desirable attributes in output waveforms.

20 Claims, 1 Drawing Sheet

DIFFERENTIAL METAL-OXIDE SEMICONDUCTOR (CMOS) PUSH-PULL BUFFER

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

This invention relates to a cMOS push-pull architecture for integrated circuit applications, including data communications. More particularly, the invention concerns a cMOS push-pull buffer.

Metal-oxide semiconductor (MOS) technology is virtually the standard for digital circuits that are used for computers and telecommunications. Increasingly, cMOS (complementary MOS) technology is used in these applications.

Given the increasing use of cMOS technology for computer and telecommunications applications, it is inevitable that improvements are sought in all areas of circuit operation. One important area is the interface between circuits with dissimilar operating characteristics. In those cases where waveforms must be provided from a circuit with, say, a particular bias voltage standard to another circuit with another bias voltage standard, a buffer circuit is used to receive a signal that embodies a waveform from the first circuit and to provide the waveform to the second circuit, performing any voltage level shifts that are necessary. A frequent problem in this regard is the reactive nature of the second circuit, which can be modeled as a load with one or more capacitative components. A capacitative load can produce changes in the high-frequency characteristics of the buffered signal, lengthening rise and fall times of digital signals, for example. Consequently a great deal of consideration has been given, in the design of cMOS digital circuit buffers, to the problem of driving capacitative loads with signals that may have information rates in the GHz range.

BRIEF SUMMARY OF THE INVENTION

Our invention utilizes cMOS technology for a differentially-driven push-pull buffer circuit that has provision for driving a capacitative load at high frequencies. The circuit includes, for example, a pair of push-pull sections, and, for each push-pull section, a trickle current cMOS transistor to keep one cMOS transistor of the push-pull section slightly on when it otherwise would be turned off by an input voltage. This provides a faster operation in switching between signal states and maintains equalized rise and fall times of output waveforms.

These and other objectives and advantages of our invention become manifest when the following detailed description is read with reference to the below-described drawings.

BRIEF DESCRIPTION OF THE DRAWINGS

The objectives of this invention, as well as the invention itself, will now be explained in the following detailed description which refers to the drawings, in which.

DETAILED DESCRIPTION OF THE PREFERRED EMBODIMENT

Figures 1, 2:
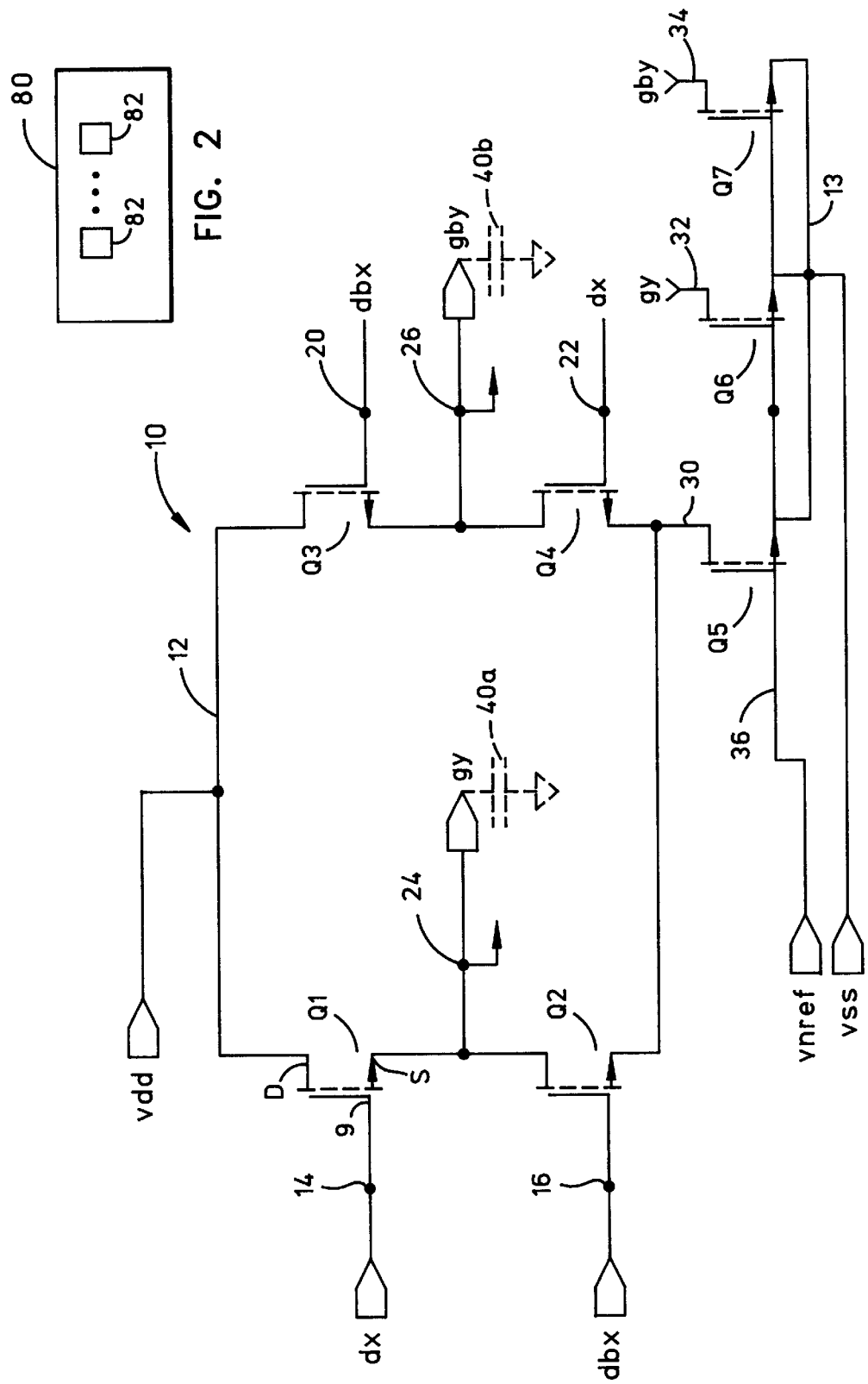
FIG. 1 is a schematic circuit diagram illustrating a differential cMOS push-pull buffer embodying our invention.
FIG. 2 is a plan view of a cMOS integrated circuit device with at least one circuit that embodies the differential cMOS buffer of FIG. 1.

In electronic design and operation, a buffer is used to separate circuits having dissimilar operating conditions, while providing the interface through which signals produced by one circuit may be transferred to the other. One significant challenge to such an interface circuit is the preservation of the attributes of a signal waveform that is being buffered to a capacitative load. Such attributes include waveform shapes and voltage levels.

A differential cMOS push-pull buffer that embodies our invention is illustrated in FIG. 1. The buffer 10 includes a first push-pull section including n-channel cMOS transistors Q1 and Q2, and a second push-pull section including n-channels cMOS transistors Q3 and Q4. The characteristic designation of the elements of an n-channel cMOS transistor are indicated for the transistor Q1 as the drain (D), gate (G) and source (S). (The drain and source may also be denominated as ""conduction regions"" in order to accommodate an embodiment of our invention in which p-channel cMOS transistors may be substituted for the n-channel devices described here.) Each of the push-pull sections is connected between a first voltage bus 12 that provides connection to a drain voltage source at potential vdd and a second voltage bus 13 that is provided for coupling to a source voltage source at potential vss. Typically, in cMOS circuits that provide for a 3.3 Vdc difference between the potentials vdd and vss, the potential vss is ground. In the first push-pull section, the drain of the transistor Q1 is connected to the bus 12, and the gate to a first input node 14. The source of the transistor Q1 is connected to the drain of the transistor Q2. The gate of the transistor Q2 is connected to a second input node 16, while the source of the transistor Q2 is connected to the source of the transistor Q4. In the second push-pull section, the drain of the transistor Q3 is connected to the bus 12, while the transistor's gate is connected to a first input node 20. The source of the transistor Q3 and the drain of the transistor Q4 are connected together, while the gate of the transistor Q4 is connected to a second input node 22. The push-pull sections are driven differentially by a differential input voltage comprising components dx and dbx. In this regard, the two set of input nodes 12/14 and 20/22 are cross-coupled to the components of the differential input signal such that the input nodes 12 and 22 are connected to receive dx, while the input nodes 14 and 20 are connected to receive dbx. In response to the differential input signal the push-pull sections produce a differential output signal including a first component qy by way of an a first output node 24 connected in common to the source of the transistor Q1 and the drain of the transistor Q2 and a second component qby through a second output node 26 connected to the source of the transistor Q3 and the drain of the transistor Q4. A current source transistor Q5 is connected to the sources of the transistors Q2 and Q4 by connection 30 to its drain. The transistor Q5 is an n-channel cMOS transistor whose gate is connected at 36 to a source of reference voltage at a potential vnref. The source of the transistor Q5 is connected to the voltage bus 13. The transistor Q5 acts as a current source for the two push-pull sections. Two other n-channel cMOS transistors Q6 and Q7 have their gates tied, with the gate of the transistors Q5, to the connection 36 by which the gates are connected to the vnref voltage source. The sources of the transistors Q6 and Q7 are connected to the voltage bus 13. The drain of the transistor Q6 is connected through a connection 32 to the first output node 24, while the drain of the transistor Q7 is connected through a connection 34 to the second output node 26.

It is well known that the current capacity of a cMOS transistor is determined by certain of its dimensions. One important dimension in determining the current-carrying capacity of a cMOS transistor is its gate width W. In the differentially-driven push-pull buffer 10, the transistors Q1–Q5 have substantially the same current-carrying capacities. However the transistors Q6 and Q7 have much smaller current-carrying capacities. Preferably, the gate widths of the transistors Q6 and Q7 are about 1/20 of the width of the gate of the transistor Q5. Thus, when fully on, the transistors Q6 and Q7 can conduct only about 1/20 of the current that the transistor Q5 is capable of conducting.

To understand the operation of the circuit of FIG. 1, assume that the differential input signal is in a state where the magnitude of the dx component is at its maximum level, while the magnitude of the dbx component is at its minimum. In this state, transistor Q1 is conducting while the transistor Q2 is turned off; current therefore flows through the transistor Q1 out into a capacitive load represented by a first capacitative component 40a. The capacitative load charges until its value rises to approximately vdd. In the other push-pull section, the transistor Q3 is off, while the transistor Q4 is on, discharging the second capacitative component 40b of the capacitative load. When the dx component of the differential input voltage transitions from high to low, the component dbx transitions from low to high. When this transition occurs, the transistor Q1 is turned off, the transistor Q2 is turned on, the transistor Q3 is turned on, and the transistor Q4 is turned off. Now, the capacitative load component 40a begins to discharge through the transistor Q2, while the capacitative load component 40b begins to charge through the transistor Q3. Since the transistor Q6 is on, it provides an initial discharge path for a portion of the charge on the capacitative load component 40a thereby speeding up the discharge transition of the capacitative component 40a. This provides a quick initial downward transition in the qy component of the differential output voltage. Very quickly, as the transistor Q2 transitions into full operation, the discharge of the capacitative load component 40a is completed. During the transition of dx from low to high and dbx from high to low, the capacitative load component 40a is charged through the transistor Q1. Because the transistor Q6 is on, its low-level trickle current keeps the transistor Q1 slightly on, speeding its transition to full on operation. In the same transition, the transistor Q3 turns off, the transistor Q4 turns on, and the capacitative load element 40b is discharged, initially through the transistor Q7 and very soon thereafter through the transistor Q4. Thus the transistors Q6 and Q7 speed up the positive and negative transitions of the respective qy and qby components of the differential input voltage by conducting small magnitude trickle currents at the output nodes 24 and 26. The directions of these currents arc from the output nodes in FIG. 1; the direction would be reversed were all the transistors of our invention p-channel devices.

FIG. 2 illustrates our invention incorporated into a monolithic integrated circuit device, during whose manufacture, all elements shown in FIG. 1 are fabricated on a substrate of silicon material. Known techniques of integrated circuit manufacture provide for the fabrication of resistors and cMOS transistors. For example, we have built the circuit described herein using a 0.35 micron digital cMOS fabrication process available from the International Business Machines Corporation, Armonk, N.Y.

In FIG. 2 an IC device 80 includes a plurality of circuits 82. Our differential cMOS push-pull buffer may be incorporated into one or more of such circuits.

While only certain preferred features of this invention have been shown by way of illustration, many changes and modifications will occur to those skilled in the art. Accordingly, it is to be understood the appended claims are intended to cover all such modifications and changes as fall within the true spirit and scope of our invention.

We claim:

1. A differential complementary metal-oxide semiconductor (cMOS) push-pull buffer, comprising:
    a first push-pull section with first and second input nodes for receiving a differential input signal having two components and an output node for providing one component of a differential output signal;
    a second push-pull section with first and second input nodes for receiving the components of the differential input signal and an output node for providing a second component of the differential output signal;
    a cMOS current source transistor connected to the first and second push-pull sections;
    a first cMOS trickle current transistor connected to a first output node for conducting a trickle current at the first output node; and
    a second cMOS trickle current transistor connected to the second output node for conducting a second trickle current at the second output node.

2. The differential cMOS push-pull buffer of claim 1, wherein each push-pull section of the first and second push-pull section includes:
    a first voltage connection for a first bias voltage;
    a first cMOS transistor with a gate, a first conduction region, and a second conduction region, the gate connected to a first input node, the first conduction region connected to the output node, and the second conduction region connected to the first voltage connection; and
    a second cMOS transistor with a gate, a first conduction region, and a second conduction region, the gate connected to the second input node, the first conduction region connected to the output node, and the second conduction region connected to the cMOS source current transistor.

3. The differential cMOS push-pull buffer of claim 2, wherein the first and second cMOS transistors of each push-pull section are n-channel transistors.

4. The differential cMOS push-pull buffer of claim 2, further including a second voltage connection for a second bias voltage, and wherein the cMOS current source transistor includes a gate, a first conduction region, and a second conduction region, the gate connected to a node for receiving a reference voltage, the first conduction region connected to the second conduction region of the second cMOS transistor of each push-pull section, and the second conduction region connected to the second voltage connection.

5. The differential cMOS push-pull buffer of claim 4, wherein the first and second cMOS transistors of each push-pull section and the cMOS current-source transistor are all n-channel transistors.

6. The differential cMOS push-pull buffer of claim 2, further including a second voltage connection for a second bias voltage, wherein each of the first and second cMOS trickle current transistors has a gate, a first conduction region, and a second conduction region, the gate connected to a node for receiving a reference voltage, the first conduction region connected to the output node of a respective push-pull section, and the second conduction region connected to the second voltage connection.

7. The differential cMOS push-pull buffer of claim 6, wherein the cMOS current source transistor includes a gate, a first conduction region, and a second conduction region, the gate connected to the node for receiving a reference voltage, the first conduction region connected to the second conduction region of the second cMOS transistor of each push-pull section, and the second conduction region connected to the second voltage connection.

8. The differential cMOS push-pull buffer of claim 7, wherein the first and second cMOS transistors of each push-pull section, the cMOS current-source transistor, and both the first and second cMOS trickle current transistors are all n-channel transistors.

9. The differential cMOS push-pull buffer of claim 1, further including a capacitative load with a first capacitative component connected to the output node of the first push-pull section and a second capacitative component connected to the output node of the second push-pull section.

10. The differential cMOS push-pull buffer of claim 1, wherein the cMOS current source transistor, and the first and second cMOS trickle current transistors are characterized by a gate width W, the gate width of each of the first and second cMOS trickle current transistors being about ½0th the gate width of the cMOS current source transistor.

11. An integrated circuit device, including:

a plurality of connected circuits;

at least one of the circuits being a metal-oxide semiconductor buffer with:

a first push-pull section with first and second input nodes for receiving a differential input signal having two components and an output node for providing one component of a differential output signal;

a second push-pull section with first and second input nodes for receiving the components of the differential input signal and an output node for providing a second component of the differential output signal;

a cMOS current source transistor connected to the first and second push-pull sections;

a first cMOS trickle current transistor connected to a first output node for conducting a trickle current at the first output node; and a second cMOS trickle current transistor connected to the second output node for conducting a second trickle current at the second output node.

12. The integrated circuit device of claim 11, further including a first voltage bus for connection to a first bias voltage source, each push-pull section of the first and second push-pull sections including:

a first cMOS transistor with a gate, a first conduction region, and a second conduction region, the gate connected to a first input node, the first conduction region connected to the output node, and the second conduction region connected to the first voltage bus; and a second cMOS transistor with a gate, a first conduction region, and a second conduction region, the gate connected to the second input node, the first conduction region connected to the output node, and the second conduction region connected to the cMOS source current transistor.

13. The integrated circuit device of claim 12, wherein the first and second cMOS transistors of each push-pull section are n-channel transistors.

14. The integrated circuit device of claim 12, further including a second voltage bus for connection to a second bias voltage source, wherein the cMOS current source transistor includes a gate, a first conduction region, and a second conduction region, the gate connected to a node for receiving a reference voltage, the first conduction region connected to the second conduction region of the second cMOS transistor of each push-pull section, and the second conduction region connected to the second voltage bus.

15. The integrated circuit device of claim 14, wherein the first and second cMOS transistors of each push-pull section and the cMOS current-source transistor are all n-channel transistors.

16. The integrated circuit device of claim 12, further including a second voltage bus for connection to a second bias voltage, wherein each of the first and second cMOS trickle current transistors has a gate, a first conduction region, and a second conduction region, the gate connected to a node for receiving a reference voltage, the first conduction region connected to the output node of a respective push-pull section, and the second conduction region connected to the second voltage bus.

17. The integrated circuit device of claim 16, wherein the cMOS current source transistor includes a gate, a first conduction region, and a second conduction region, the gate connected to the node for receiving a reference voltage, the first conduction region connected to the second conduction region of the second cMOS transistor of each push-pull section, and the second conduction region connected to the second voltage bus.

18. The integrated circuit device of claim 17, wherein the first and second cMOS transistors of each push-pull section, the cMOS current-source transistor, and both the first and second cMOS trickle current transistors are all n-channel transistors.

19. The integrated circuit device of claim 11, further including a capacitative load with a first capacitative component connected to the output node of the first push-pull section and a second capacitative component connected to the output node of the second push-pull section.

20. The integrated circuit device of claim 11, wherein the cMOS current source transistor, and the first and second cMOS trickle current transistors are characterized by a gate width W, the gate width of each of the first and second cMOS trickle current transistors being about ½0th the gate width of the cMOS current source transistor.

* * * * *

UNITED STATES PATENT AND TRADEMARK OFFICE
CERTIFICATE OF CORRECTION

Page 1 of 2

PATENT NO. : 5,955,924
DATED : September 21, 1999
INVENTOR(S) : Bryan et al

It is certified that error appears in the above-identified patent and that said Letters Patent is hereby corrected as shown below:

Title page, item [54] and col. 1, line 2,

IN THE TITLE

Change "(CMOS)" to --(MOS)

IN THE ABSTRACT

Change each occurrence of "cMOS" to --MOS--

IN THE ENTIRE PATENT

Change each occurrence of "cMOS" to --MOS-- as follows:

Column 1, lines 2, 18, 20, 24, 27, 44, 49, 53, and 54.
Column 2, lines 2, 4, 5, 18, 20, 23, 27, 33, 62, and 66.
Column 3, lines 8 and 11.
Column 4, lines 1, 2, 6, 16, 25, 27, 30, 33, 37, 43, 47, 49, 50, 52, 54, 58, 61, 62, 63, and 65.
Column 5, lines 1, 8, 9, 13, 16, 17, 18, 19, 21, 26, 27, 28, 30, 31, 44, 46, 49, and 56.
Column 6, lines 3, 7, 10, 14, 19, 22, 23, 27, 35, 39, 43, 44, 45, 53, 54, 56, and 57.

UNITED STATES PATENT AND TRADEMARK OFFICE
CERTIFICATE OF CORRECTION

PATENT NO. : 5,955,924
DATED : September 21, 1999
INVENTOR(S) : Bryan, et. al.

It is certified that error appears in the above-identified patent and that said Letters Patent is hereby corrected as shown below:

Claim 2, column 4, line 35, change "section" to --sections--.

Signed and Sealed this

Seventh Day of March, 2000

Attest:

Attesting Officer

Q. TODD DICKINSON

Commissioner of Patents and Trademarks